(12) United States Patent  
Okawara

(10) Patent No.: US 9,318,590 B2
(45) Date of Patent: Apr. 19, 2016

(54) IGBT USING TRENCH GATE ELECTRODE

(71) Applicant: Jun Okawara, Miyoshi (JP)

(72) Inventor: Jun Okawara, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/773,511

(22) PCT Filed: Apr. 2, 2013

(86) PCT No.: PCT/JP2013/060022
§ 371 (c)(1),
(2) Date: Sep. 8, 2015

(87) PCT Pub. No.: WO2014/162498
PCT Pub. Date: Oct. 9, 2014

(65) Prior Publication Data
US 2016/0064537 A1 Mar. 3, 2016

(51) Int. Cl.
H01L 29/739 (2006.01)
H01L 29/08 (2006.01)
H01L 29/06 (2006.01)
H01L 29/10 (2006.01)

(52) U.S. Cl.
CPC ........ *H01L 29/7397* (2013.01); *H01L 29/0696* (2013.01); *H01L 29/0804* (2013.01); *H01L 29/0821* (2013.01); *H01L 29/1095* (2013.01)

(58) Field of Classification Search
CPC ............ H01L 29/0619; H01L 29/7397; H01L 29/0696; H01L 29/0821; H01L 29/1095; H01L 29/0804
USPC ........................................................ 257/139
See application file for complete search history.

(56) References Cited

U.S. PATENT DOCUMENTS

| 2002/0006703 | A1* | 1/2002 | Pfirsch | H01L 29/045 438/268 |
| 2005/0161735 | A1* | 7/2005 | Aoki | H01L 21/28194 257/330 |
| 2008/0012040 | A1* | 1/2008 | Saito | H01L 29/0696 257/133 |
| 2012/0025874 | A1* | 2/2012 | Saikaku | H01L 29/1095 327/109 |
| 2014/0054645 | A1* | 2/2014 | Saito | H01L 29/0696 257/139 |
| 2015/0069461 | A1* | 3/2015 | Misu | H01L 29/7397 257/139 |
| 2015/0123164 | A1* | 5/2015 | Park | H01L 29/7397 257/139 |
| 2015/0279953 | A1* | 10/2015 | Machida | H01L 29/456 257/330 |

FOREIGN PATENT DOCUMENTS

| JP | 2008-027945 A | 2/2008 |
| JP | 2012-190938 A | 10/2012 |

* cited by examiner

*Primary Examiner* — Christine Enad
(74) *Attorney, Agent, or Firm* — Oliff PLC

(57) ABSTRACT

An IGBT includes a trench gate electrode that is bent when a semiconductor substrate is seen in a plan view, and an inner semiconductor region of the same conductivity type as an emitter region is formed at a position inside a bent portion of the trench gate electrode and exposed on a front surface of the semiconductor substrate. The trench gate electrode is bent, and therefore, a hole density during operation increases, whereby conductivity modulation phenomenon is accelerated, and an on-state voltage is reduced. When the IGBT is turned off, the inner semiconductor region influences a movement path of the holes so that a moving distance thereof through a body region becomes short. The holes escape easily to a body contact region when the IGBT is turned off. Increase of current density during the operation and prevention of a latchup are both achieved.

6 Claims, 10 Drawing Sheets

IGBT USING TRENCH GATE ELECTRODE

TECHNICAL FIELD

This specification discloses a technology regarding an IGBT that uses a trench gate electrode.

BACKGROUND ART

Patent Document 1 discloses an IGBT having trench gate electrodes that are bent when a semiconductor substrate is seen in a plan view. With the bent trench gate electrodes, as compared to linearly extending trench gate electrodes, a hole density increases in a drift region positioned inside the bent portions, which accelerates a conductivity modulation phenomenon and lowers an on-state voltage of the IGBT. It is noted that Patent Document 1 was not published at the time when the present application was filed.

In IGBTs, aside from a low on-state voltage, current between an emitter and a collector must be shut off when a voltage on the trench gate electrode is switched to an off-state voltage. A phenomenon in which current keeps flowing between the emitter and the collector even after the voltage on the trench gate electrode is switched to the off-state voltage is herein referred to as a "latchup". It is necessary that no latchup should occur in IGBTs.

CITATION LIST

Patent Document

Patent Document 1: Specification and drawings attached to Japanese Patent Application No. 2011-052100

SUMMARY OF INVENTION

Technical Problem

To prevent a latchup in an IGBT, a design has been employed that reduces saturated current to allow holes to easily escape to an emitter electrode during a turnoff. With a trench gate electrode mentioned above, i.e., a bent trench gate electrode, is used, a current density will rise and the latchup phenomenon will occur more readily. A novel technique for preventing the latchup is necessary in order to enable practical use of a technology to reduce an on-state voltage with the use of bent trench gate electrode. Namely, a novel technique for allowing holes to readily escape to the emitter electrode during the turnoff is required.

This specification discloses a configuration that allows holes to readily escape to an emitter electrode during a turnoff in an IGBT that uses a bent trench gate electrode, thereby disclosing a technique to prevent the latchup. This technique allows for use of the bent trench gate electrode while preventing the latchup, and lowers the on-state voltage of the IGBT.

Solution to Problem

In an IGBT disclosed in this specification, a trench gate electrode is bent when a front surface of a semiconductor substrate is seen in a plan view. A semiconductor region (hereinafter referred to as "inner semiconductor region") of the same conductivity type as an emitter region (i.e., conductivity type opposite from that of a base or body region) is formed at a position inside a bent portion of the trench gate electrode and exposed on the front surface of the semiconductor substrate, and the inner semiconductor region is in a floating state. That is, the inner semiconductor region is not configured to become electrically connected to any of an emitter electrode, the trench gate electrode, and a collector electrode.

When a voltage of the trench gate electrode of the IGBT is switched to an off-state voltage, holes accumulated in a drift or bulk region (hereinafter referred to as "drift region") move along the trench gate electrode through the body or base region (hereinafter referred to as "body region") and escape from a body contact region to the emitter electrode. Since the body region needs to have a concentration of impurities that allows for formation of an inverted layer when an on-state voltage is applied to the trench gate electrode, it has a low concentration of impurities, and therefore the holes can hardly move through it (hereinafter the body region may sometimes be referred to as "low-concentration body region" in order to distinguish it from the body contact region. They are the same.).

Without provision of the inner semiconductor region in the floating state mentioned above, a moving distance of the holes through high-resistance and low-concentration body regions during a turnoff becomes long, so that the holes cannot readily escape to the emitter electrode. In contrast, with the provision of the inner semiconductor region, and with the inner semiconductor region being in the floating state, the moving distance of the holes through the high-resistance and low-concentration body regions during the turnoff becomes short, so that the holes can readily escape to the emitter electrode. By employing this configuration, not only the current density during operation is increased due to the bending of the trench gate electrode, but also the latchup phenomenon can be prevented.

The inner semiconductor region and the emitter region may preferably be made of the same composition. This allows for formation of the inner semiconductor region during a process of forming the emitter region.

A configuration in which an interlayer insulating film that covers an upper surface of the trench gate electrode and insulates the trench gate electrode from the emitter electrode has been known. This interlayer insulating film may preferably be extended as far as to a surface of the inner semiconductor region. Thereby, the interlayer insulating film insulates the inner semiconductor region from the emitter electrode. This way, the inner semiconductor regions can be kept in the floating state without increasing the number of production process steps.

It is advantageous that the trench gate electrode be bent at a plurality of locations in order to reduce the on-state voltage. For this reason, the trench gate electrode may preferably be formed in a pattern of connected T shapes. Thereby, the bent portions can be evenly distributed over a wide area of the semiconductor substrate.

The body contact region may be separated from the inner semiconductor region by the body region in the plan view of the semiconductor substrate, and also the body contact region may be separated from the gate insulating film by the body region. In an IGBT, the emitter region and the trench gate electrode need to face each other via the gate insulating film. The emitter region and the trench gate electrodes need to be doped with impurities to reduce resistance. If the two adjacent regions are doped with impurities of different conductivity types, there will be variation in an effective impurity concentration due to the variations in the areas doped with impurities, which may cause variations in properties among mass-produced semiconductor devices. Thus, the emitter region and the trench gate electrode may preferably be doped with impurities of the same conductivity type. Consequently, the conductivity type of the trench gate electrode will be opposite from that of the body contact region. If the body contact region can be provided at positions facing the trench gate electrodes via the gate insulating film, the holes can escape even better during the turnoff and the latchup phenomenon can be prevented. To do so, however, there is a need to dope two adjacent regions with impurities of different conductivity types, which may cause variations in the properties of mass-produced semiconductor devices. In a configuration in which the body contact region is separated from the inner semiconductor region by the body region in a plan view of the semiconductor substrate, or in a configuration in which the body contact region is separated from the gate insulating film by the body region, there is no need to dope two adjacent regions with impurities of different conductivity types. With the technology in which the inner semiconductor region is added to the configuration in which the body contact region is separated from the gate insulating film by the body region, it is possible to mass-produce semiconductor devices with the low on-state voltage, with little property variations, and in which the latchup may hardly occur.

DESCRIPTION OF EMBODIMENTS

First Embodiment

Figure 1:
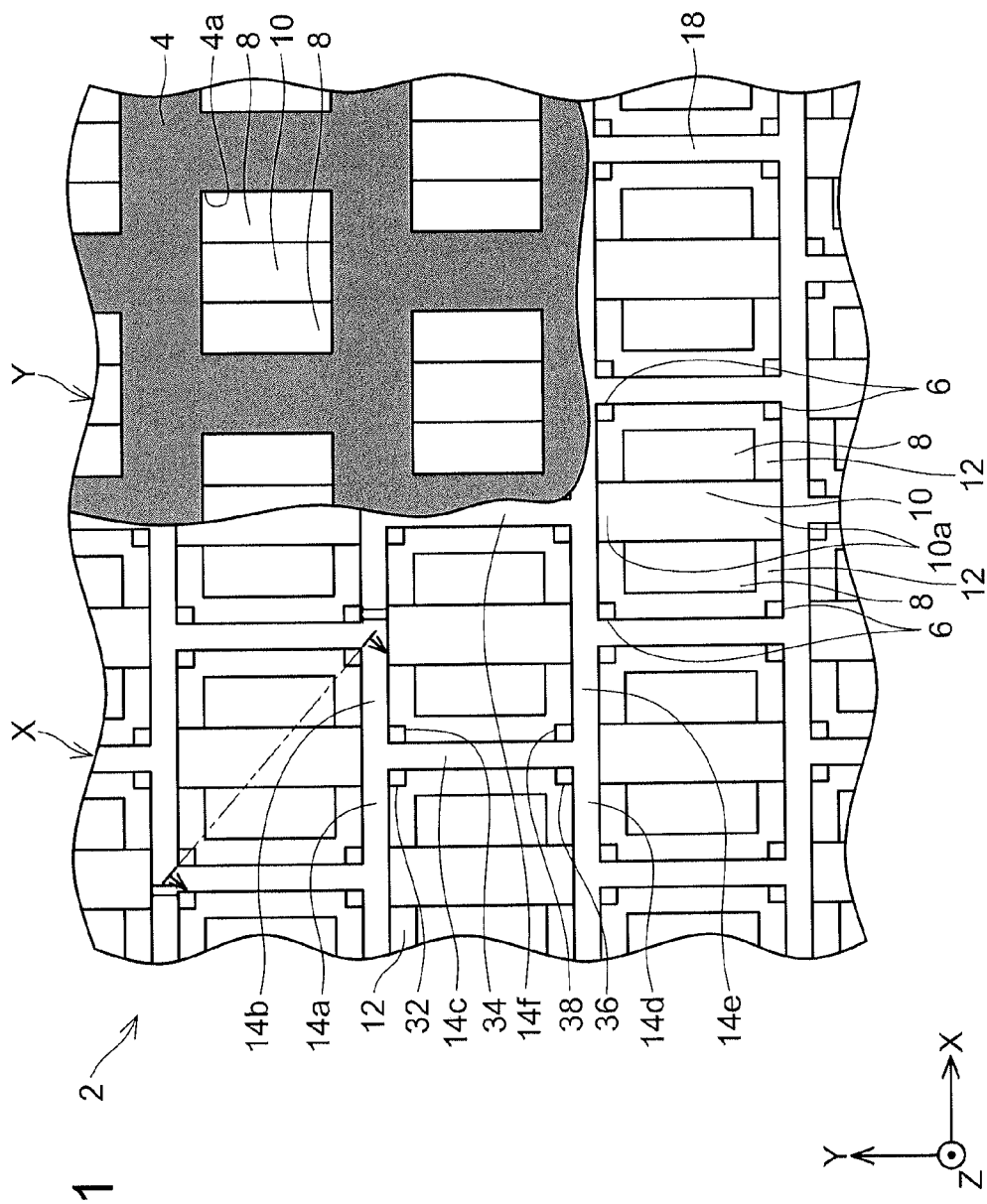
FIG. 1 is a diagram of a semiconductor substrate of an IGBT according to a first embodiment seen in a plan view, an area X illustrating a plan view in which emitter electrodes and interlayer insulating film are removed, and an area Y illustrating a plan view in which the emitter electrodes are removed.
Figure 2:
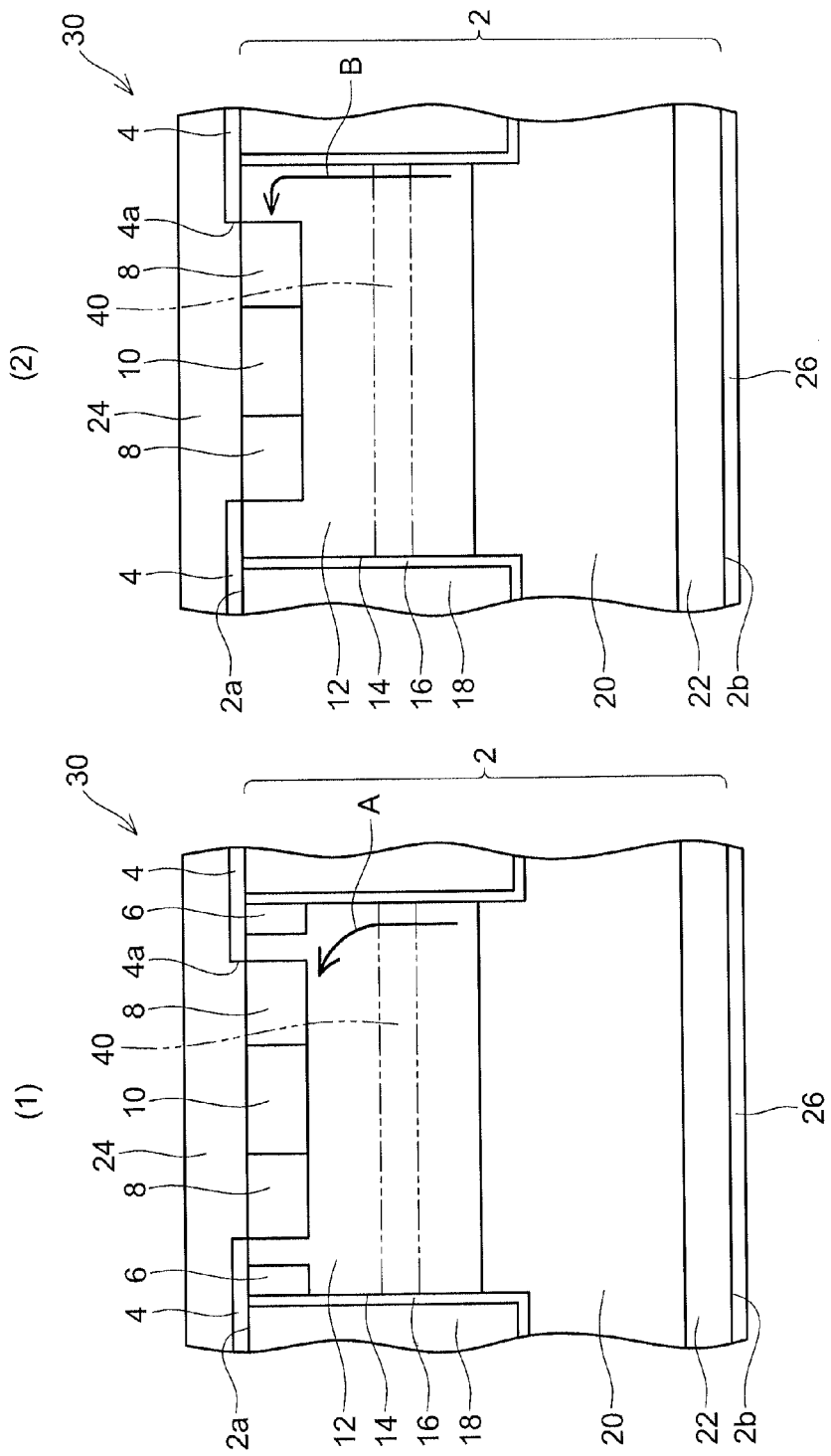
FIG. 2(1) is a cross-sectional view along line II-II of FIG. 1, and FIG. 2(2) is a cross-sectional view of an existing IGBT.

FIG. 1 is a diagram of a semiconductor substrate 2 of an IGBT 30 according to a first embodiment seen in a plan view, and FIG. 2(1) is a cross-sectional view along line II-II of FIG. 1. In FIG. 1, an area X shows a plan view in which the emitter electrodes and interlayer insulating film are removed, and an area Y shows a plan view in which the emitter electrodes are removed. This applies also to FIG. 3 and FIG. 5. The IGBT 30 includes the semiconductor substrate 2, the emitter electrode 24 formed on a front surface 2a of the semiconductor substrate 2, and a collector electrode 26 formed on a back surface 2b of the semiconductor substrate 2. The emitter electrode 24 and collector electrode 26 are made of metal.

The following regions are formed in the semiconductor substrate 2:

Emitter region 10: It is located to be exposed on an area of the front surface 2a of the semiconductor substrate 2. It is doped with a high concentration of an n-type impurity and in ohmic contact with the emitter electrode 24.

Body contact region 8: It is located to be exposed on an area of the front surface 2a of the semiconductor substrate 2. It is doped with a high concentration of a p-type impurity and in ohmic contact with the emitter electrode 24. While it is sometimes called "base contact region", it is herein referred to as "body contact region". The emitter region 10 is exposed on a different area of the front surface 2a of the semiconductor substrate 2 than the area of the front surface 2a of the semiconductor substrate 2 the body contact region 8 is exposed on.

Inner semiconductor region 6: It is formed of the same composition and to the same depth as the emitter region 10. As shown in FIG. 1, it is formed at a position inside a bent portion of a trench gate electrode 18 to be described later and is exposed on an area of the front surface 2a of the semiconductor substrate 2.

Body region 12: It is in contact with the emitter region 10, body contact regions 8, and inner semiconductor regions 6, and extended deeper than these regions 10, 8, and 6. It is doped with a low concentration of the p-type impurity. While it is sometimes called "base region", it is herein referred to as "body region". The body region 12 faces the front surface 2a of the semiconductor substrate 2 in areas where the emitter region 10, body contact region 8, and inner semiconductor region 6 are not formed.

Drift region 20: It separates the body region 12 from a collector region 22 to be described later. It is a region of the semiconductor substrate 2 doped with a low concentration of the n-type impurity and left unprocessed, and sometimes called a "bulk region". It is herein referred to as "drift region".

Collector region 22: It is located to be exposed on the back surface 2b of the semiconductor substrate 2. It is doped with a high concentration of the p-type impurity and in ohmic contact with the collector electrode 26.

Trench 14 is formed to extend in a depth direction from the front surface 2a of the semiconductor substrate 2. The trench 14 extends from the front surface 2a through the body region 12 and reaches the drift region 20. The trench 14 is formed in a pattern in which T-shapes that form one unit (see trench portions 14a, 14b, and 14c) are connected both in X and Y directions when the semiconductor substrate 2 is seen in the plan view. When the trench portions 14a and 14c are viewed, for example, it can be seen that the trench 14 is bent. It can be said that a point denoted by reference numeral 32 is located inside a bent portion. Likewise, it can be said that a point denoted by reference numeral 34 is located inside a bent portion between the trench portions 14b and 14c, a point denoted by reference numeral 36 is located inside a bent portion between the trench portions 14d and 14c, and a point denoted by reference numeral 38 is located inside a bent portion between the trench portions 14e and 14c. Trench portions 14b, 14c, 14e, and 14f form a rectangular area. It can also be said that each rectangular area forms one unit of the IGBT 30. Thus each rectangular area is herein referred to as "cell". One cell has four apexes, and the inner semiconductor region 6 is formed at each apex.

The side wall and bottom surface (collectively referred to as "wall surface") of trench 14 are covered with a gate insulating film 16. The trench gate electrode 18 is filled inside the film. The gate insulating film 16 is made of silicon oxide, while the trench gate electrode 18 is made of polysilicon doped with impurities.

At points denoted by reference numeral 10a in FIG. 1, the emitter region 10 faces trench gate electrode 18 via the gate insulating film 16. The body region 12 that separates the emitter region 10 and the drift region 20 at points 10a in a depth direction also faces the trench gate electrode 18 via the gate insulating film 16. The emitter region 10 is of an n-type, the body region 12 is of a p-type, and the drift region 20 is of the n-type, so the emitter region 10 and drift region 20 are normally not electrically connected to each other. When, however, a positive voltage is applied to the trench gate electrode 18, the body region 12 that faces the trench gate electrode 18 via the gate insulating film 16 inverts to the n-type in conductivity, so that the emitter region 10 and drift region 20 become electrically connected to each other.

Reference numeral 4 denotes an interlayer insulating film that covers upper surfaces of the trench gate electrode 18 and insulates the trench gate electrode 18 from the emitter electrode 24. The interlayer insulating film 4 also covers upper surfaces of the inner semiconductor regions 6 and insulates the inner semiconductor regions 6 from the emitter electrode 24. Since the inner semiconductor regions 6 are insulated from the emitter electrode 24 by the interlayer insulating film 4 and insulated from the trench gate electrode 18 by the gate insulating film 16, when the IGBT 30 is turned off, the inner semiconductor regions 6 are insulated from the collector electrode 26 by p-n junctions. During the OFF-time of the IGBT 30, the inner semiconductor regions 6 are in a floating state. Reference numeral 4a denotes openings 4a formed in the interlayer insulating film 4. The emitter region 10 and body contact region 8 are conductive to the emitter electrode 24 because of the corresponding opening 4a.

A layer 40 indicated by imaginary lines is of an n-type layer and is formed in an intermediate depth of the p-type body region 12. The body region 12 is divided in half into an upper region and a lower region by the n-type layer 40. The n-type layer 40 can be omitted.

As shown in FIG. 1, the emitter regions 10 and inner semiconductor regions 6 are formed at positions adjoining the trench gate electrode 18. These regions are both of n-type, and any variation in the areas doped with impurities hardly affects the effective concentration of impurities. The body contact regions 8 and trench gate electrode 18 are of different conductivity types but they are separated from each other by the body region 12, so that there is no need to dope the adjacent two regions with impurities of different conductivity types. The configuration of FIG. 1 can be produced without doping adjacent two regions with impurities of different conductivity types. Although the trench gate electrode 18 adjoin the body region 12, the concentration of doped impurities in the body region 12 is low, so that these trench gate electrode 18 and body region 12 that are of opposite conductivity types adjoining each other do not largely affect performances of the semiconductor device.

Arrow A in FIG. 2(1) indicates a movement path of holes when the device is turned off. The holes move along a path that detours the inner semiconductor regions 6 because of n-p barriers between the n-type inner semiconductor regions 6 and the p-type body region 12.

FIG. 2(2) shows a case where the n-type inner semiconductor regions 6 are not formed, in which the holes move along a movement path B when the device is turned off. Namely, the holes move along the gate electrode 18 and then move along and close to the front surface 2a of the semiconductor substrate 2 and reach the body contact regions 8.

A comparison between FIG. 2(1) and FIG. 2(2) clearly shows that the distance indicated by the arrow A is short while the distance indicated by the arrow B is long. That is, if there is no n-type inner semiconductor region 6, the moving distance of the holes through the body region 12, which has a low concentration of impurities and a high resistance, is long, while on the other hand, the formation of the n-type inner semiconductor region 6 allows the moving distance of the holes through the body region 12 to become short. The formation of the n-type inner semiconductor region 6 allows the holes to escape easily to the body contact region 8 when the device is turned off so that the latchup can hardly occur.

The IGBT 30 has its collector electrode 26 connected to a positive voltage, while the emitter electrode 24 is grounded when in use.

When no positive voltage is applied to the trench gate electrode 18, the n-type emitter regions 10 and the n-type drift region 20 are separated from each other by the p-type body region 12 therebetween, so that the IGBT 30 is turned off.

When the positive voltage is applied to the trench gate electrode 18, an area of the body region 12, which separates the n-type emitter regions 10 and the n-type drift region 20, and which faces the trench gate electrode 18 via the gate insulating film 16, inverts to the n-type in conductivity, whereby a channel is formed. As a result, electrons move from the emitter electrode 24 to the drift region 20 through the emitter regions 10 and the channels, and the holes move from the collector electrode 26 to the drift region 20 through the collector region 22. The IGBT 30 thus conducts because of the conductivity modulation phenomenon that occurs in the drift region 20. In the IGBT 30, the trench gate electrode 18 is bent. The hole density in the drift regions, which are located inside the bent portions, increases, so that the conductivity modulation phenomenon is accelerated. The on-state voltage of the IGBT 30 is thus reduced by bending the trench gate electrode 18.

To turn off the IGBT 30 again, application of the positive voltage to the trench gate electrode 18 is stopped. Changing the state of the device from ON to OFF is herein referred to as "turnoff". The latchup phenomenon, in which current keeps flowing between the emitter electrode and collector electrode even after application of the positive voltage to the trench gate electrodes is stopped, tends to occur in IGBTs because of their thyristor configuration. The IGBT 30, as has been described with reference to FIG. 2(1) and FIG. 2(2), is designed such that holes can easily escape to the emitter electrode 24 through the body contact regions 8 when the device is turned off, and thus no latchup occurs.

Second Embodiment

Below, only different points from the first embodiment will be explained, to omit repetitive description. The same applies to the third and any further embodiments.

Figure 3:
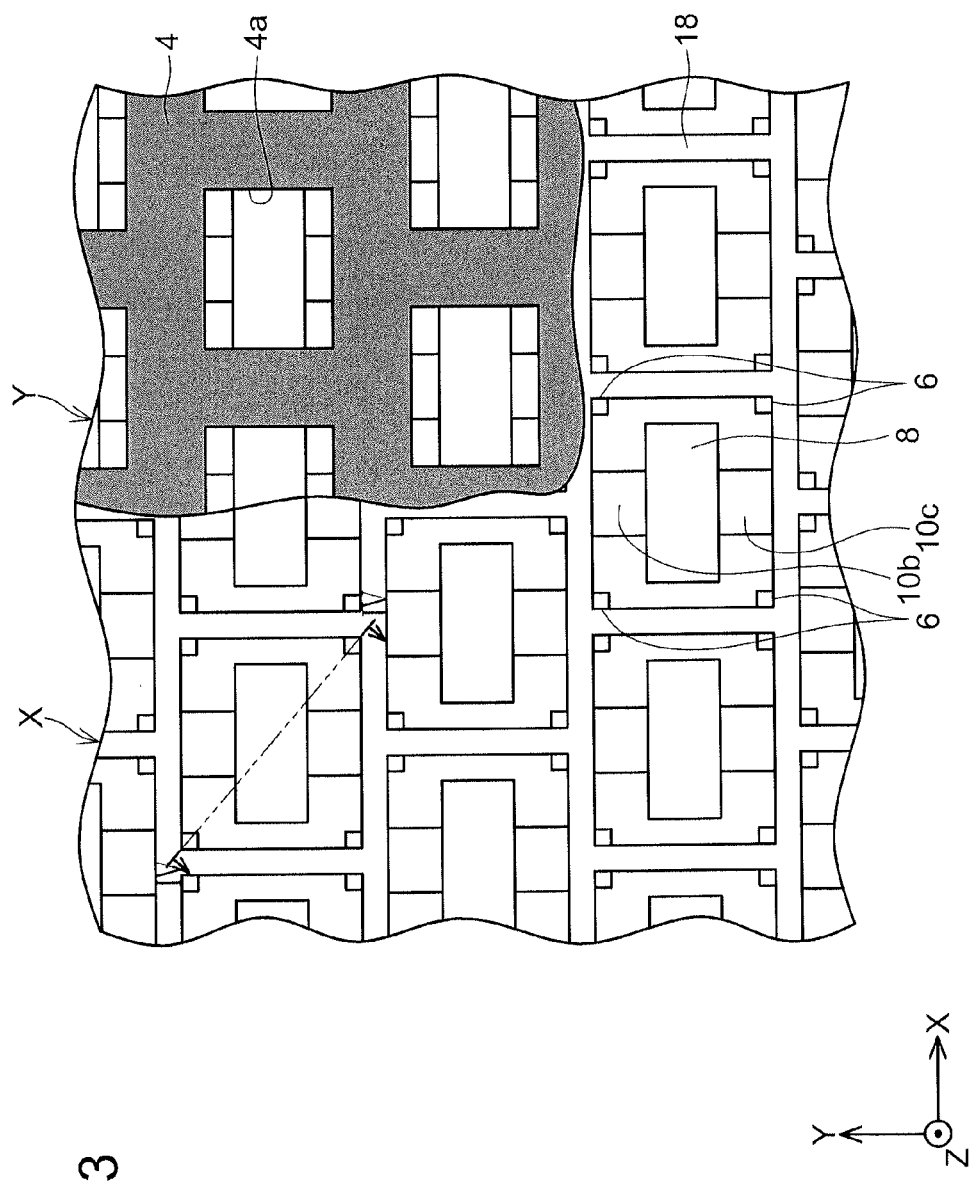
FIG. 3 is a diagram of a semiconductor substrate of an IGBT according to a second embodiment seen in the plan view.
Figure 4:
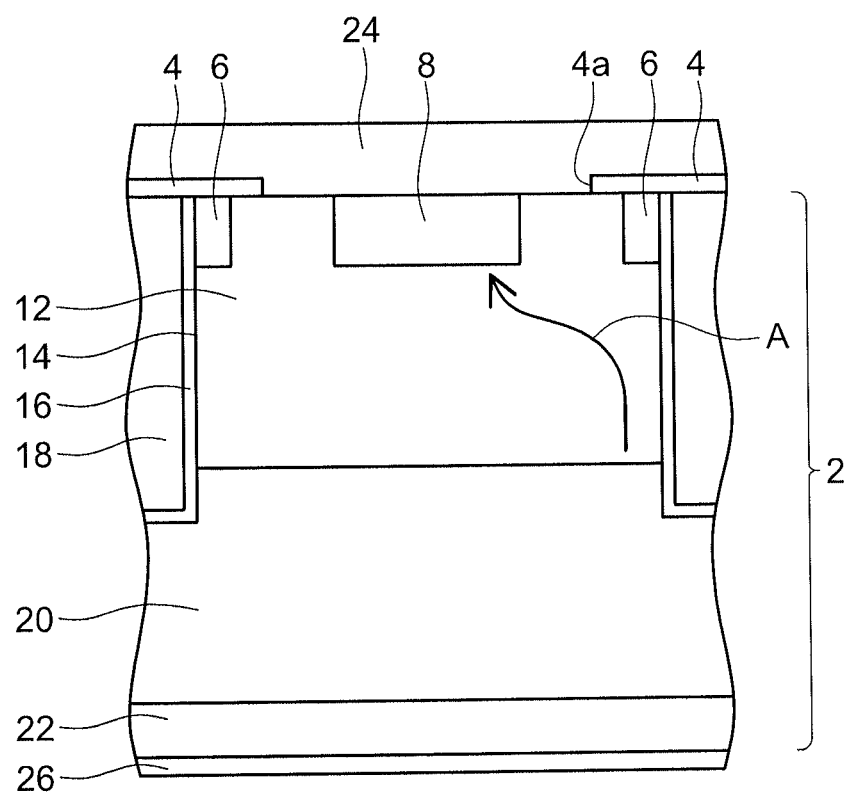
FIG. 4 is a cross-sectional view along line IV-IV of FIG. 3.

As shown in FIG. 3, in the second embodiment, the emitter region 10 is divided into two regions 10b and 10c by the body contact region 8. In this case as well, latchup can be prevented by forming inner semiconductor regions 6.

Third Embodiment

Figure 5:
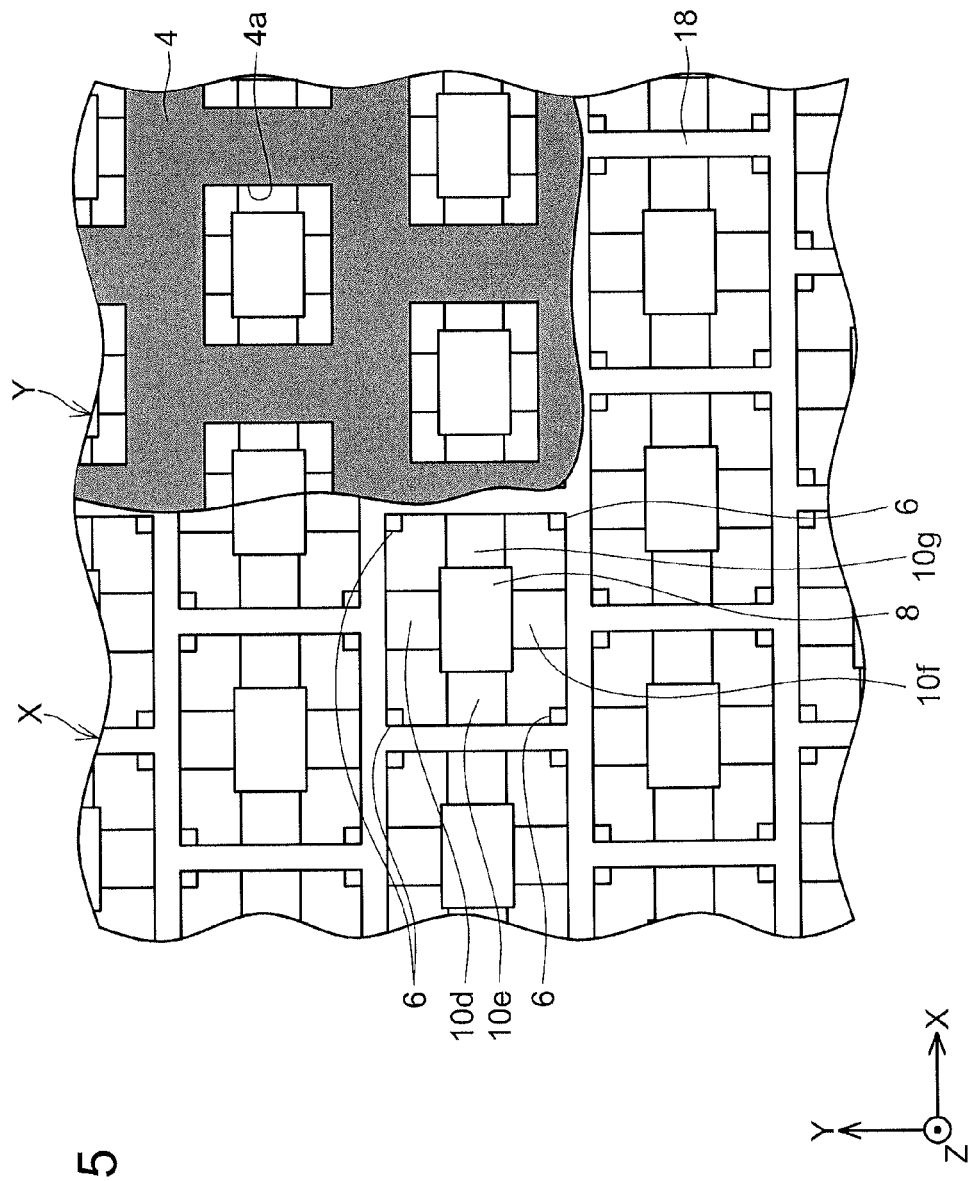
FIG. 5 is a diagram of a semiconductor substrate of an IGBT according to a third embodiment seen in a plan view.
Figure 6:
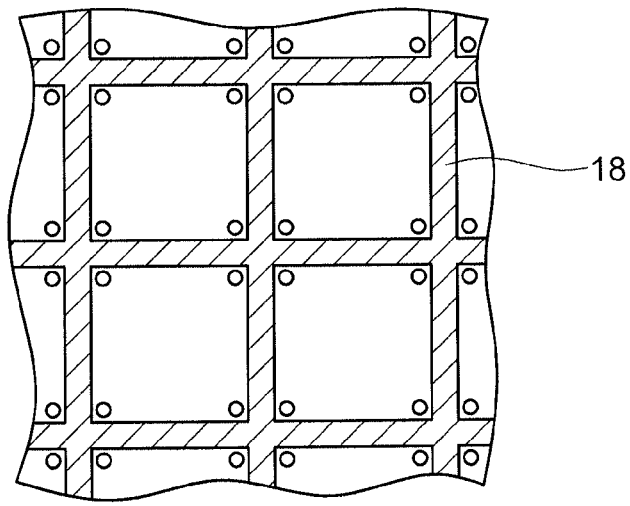
FIG. 6 is a diagram illustrating pattern 1 of bent trench gate electrodes.
Figure 7:
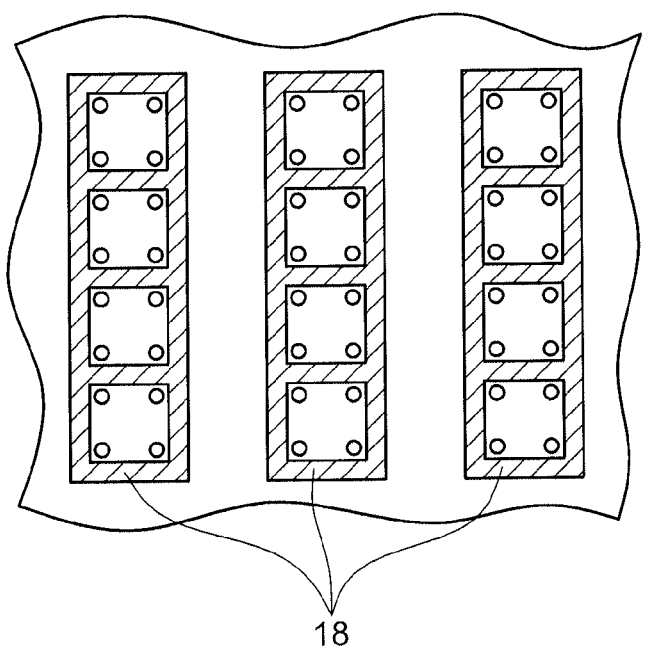
FIG. 7 is a diagram illustrating pattern 2 of bent trench gate electrodes.
Figure 8:
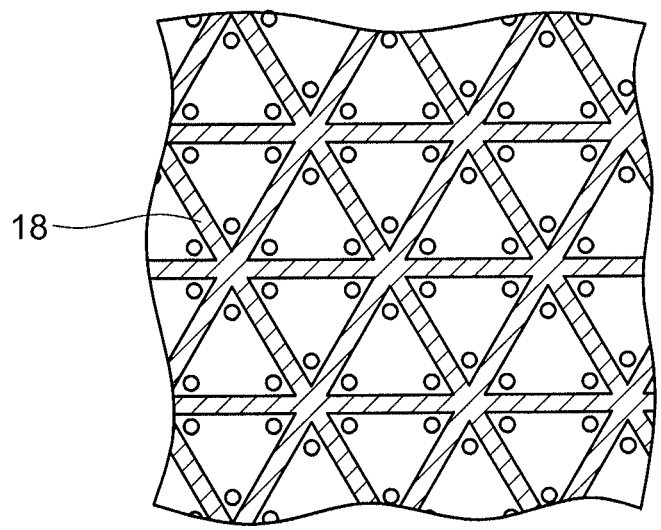
FIG. 8 is a diagram illustrating pattern 3 of bent trench gate electrodes.
Figure 9:
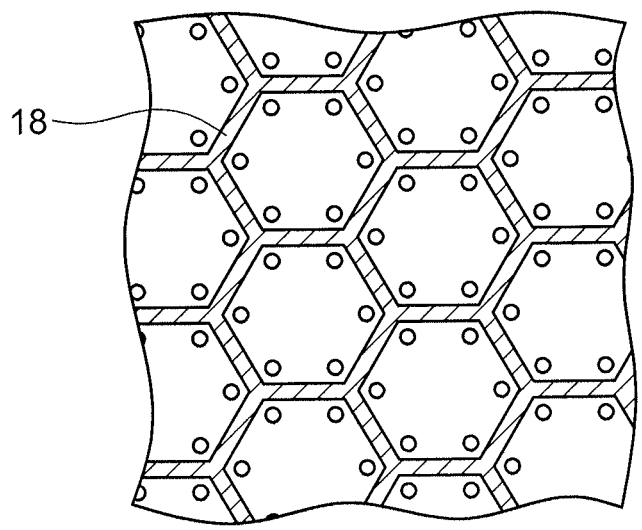
FIG. 9 is a diagram illustrating pattern 4 of bent trench gate electrodes.
Figure 10:
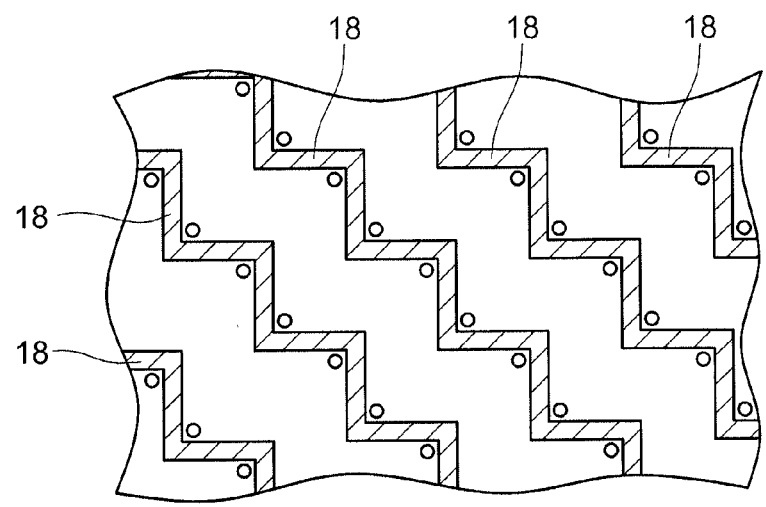
FIG. 10 is a diagram illustrating pattern 5 of bent trench gate electrode.
Figure 11:
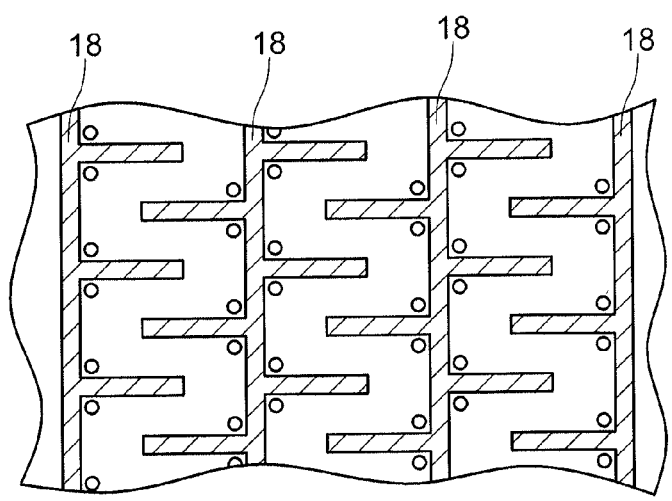
FIG. 11 is a diagram illustrating pattern 6 of bent trench gate electrodes.
Figure 12:
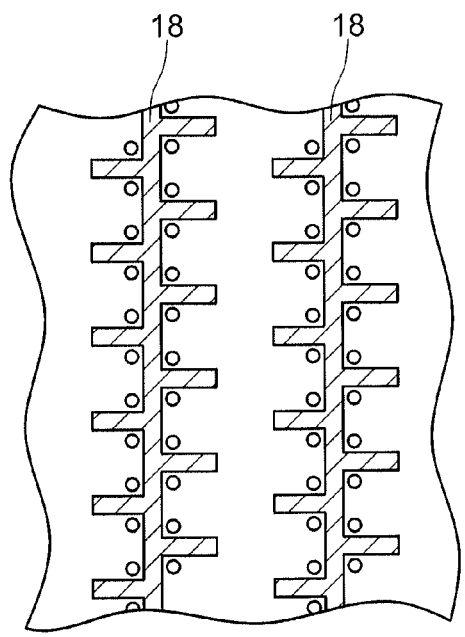
FIG. 12 is a diagram illustrating pattern 7 of bent trench gate electrodes.

As shown in FIG. 5, in the third embodiment, the emitter region 10 is divided into four regions 10d, 10e, 10f, and 10g by the body contact region 8. In this embodiment, the emitter region that faces the trench gate electrode 18 to supply electrons to the channel is formed at four locations, so that the on-state voltage is low. Latchup can occur even more easily, but in this case also, the latchup can be prevented by forming inner semiconductor regions 6.

(Examples of Bent Trench Gate Electrodes)

Figure 13:
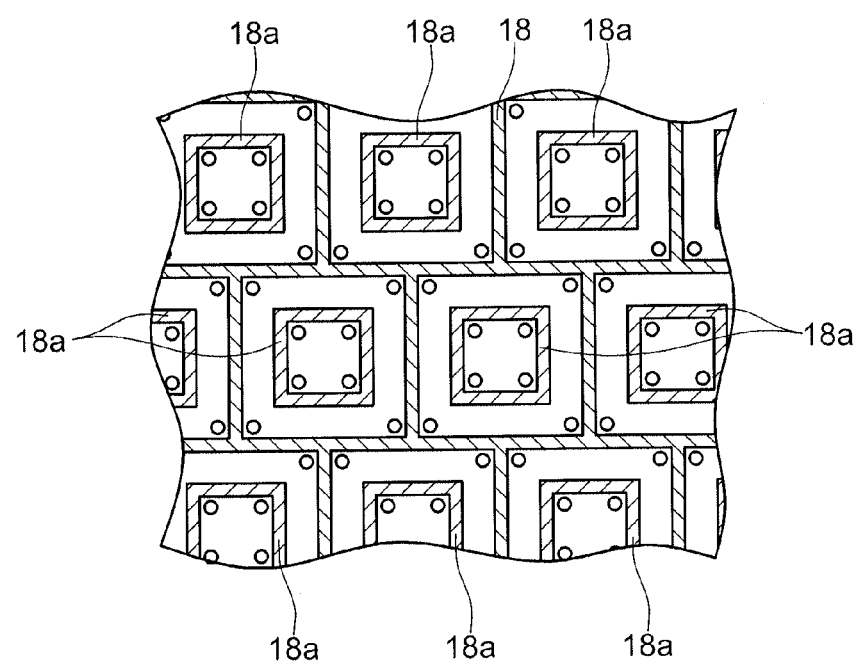
FIG. 13 is a diagram illustrating pattern 8 of bent trench gate electrodes.
Figure 14:
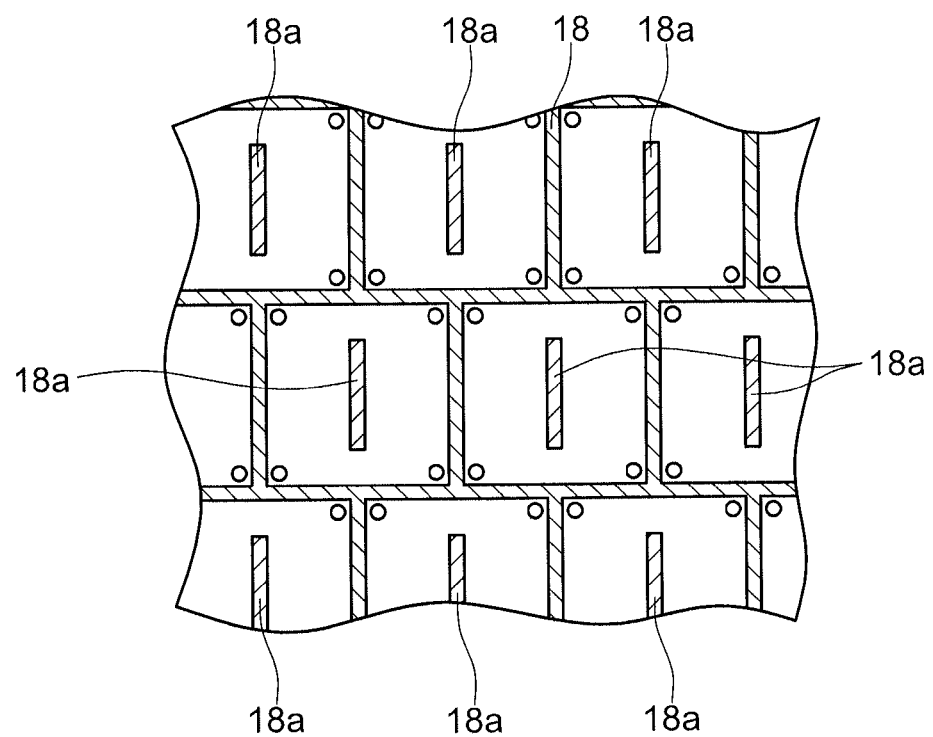
FIG. 14 is a diagram illustrating pattern 9 of bent trench gate electrodes.

FIGS. 6 to 14 show examples of bent trench gate electrodes. Points denoted at circles indicate areas positioned inside the bent portions. Latchup can be prevented by forming inner semiconductor regions 6 in corner portions indicated by the circles. Reference numerals 18a in FIG. 13 and FIG. 14 denote dummy trenches. "Dummy trench" here refers to one that has the same configuration as that of the trench gate electrode 18 but is not connected to a gate voltage adjusting circuit and therefore in a floating state. As shown in FIG. 13, inner semiconductor regions 6 may be formed in areas positioned inside bent portions of the dummy trenches 18a. Alternatively, no inner semiconductor regions 6 may be formed in the areas positioned inside bent portions of the dummy trenches 18a. While the body region and contact region are of p-type in the description above, they may be of the opposite conductivity type.

In the embodiments described above, the emitter region 10 and the inner semiconductor regions 6 are formed of a same composition and to a same depth. Therefore the emitter region 10 and the inner semiconductor regions 6 can be formed simultaneously. The interlayer insulating film 4 that insulates the trench gate electrode 18 from the emitter electrode 24 also insulates the inner semiconductor regions 6 from the emitter electrode 24. Therefore no additional insulating layer needs to be added to insulate the inner semiconductor regions 6 from the emitter electrode 24. These factors allow for easy production of the IGBTs according to the embodiments.

While embodiments have been described in detail above, these are given for illustrative purposes only and not to limit the scope of the claims. The technology as set forth in the claims includes various modifications and changes made to the specific examples given above.

The technical elements described in the specification or drawings exhibit intended technical utility either alone or in various combinations that are not limited to the combinations as set forth in the claims at the time of filing. The technology illustrated in the specification or drawings achieves several objects at the same time, and achieving one of the objects itself has technical utility.

DESCRIPTION OF REFERENCE SIGNS

2: Semiconductor substrate
2a: Front surface
2b: Back surface
4: Interlayer insulating film
4a: Opening
6: Inner semiconductor region (n-type)
8: Body contact region (p-type)
10: Emitter region (n-type)
10a: Area facing the trench gate electrode 18
10b, 10c: Emitter region divided by the body contact region
10d, 10e, 10f, 10g: Emitter region divided by the body contact region
12: Body region (base region) (p-type)
14: Trench
14a, 14b, 14c, 14d, 14e, and 14f: Trench portions
16: Gate insulating film
18: Trench gate electrode
20: Drift region (bulk region) (n-type)
22: Collector region (p-type)
24: Emitter electrode
26: Collector electrode
30: IGBT
32, 34, 36, and 38: Areas positioned inside bent trenches
A, B: Movement path of holes
Circle: Positions inside bent trenches

The invention claimed is:

1. An IGBT comprising:
a semiconductor substrate;
an emitter electrode formed on a front surface of the semiconductor substrate; and
a collector electrode formed on a back surface of the semiconductor substrate,
wherein the semiconductor substrate comprises:
an emitter region exposed on the front surface of the semiconductor substrate;
a collector region exposed on the back surface of the semiconductor substrate;
a body region contacting the emitter region and extending deeper than the emitter region;
a drift region separating the body region and the collector region; and
a body contact region exposed on the front surface of the semiconductor substrate, the semiconductor substrate being formed with:
a trench extending from the front surface of the semiconductor substrate and reaching the drift region;
a gate insulating film covering a wall of the trench; and
a trench gate electrode filled in the trench,
the trench gate electrode faces the emitter region, the body region, and the drift region in this order via the gate insulating film,
the emitter region and the body contact region are configured to be electrically connected to the emitter electrode,
the trench gate electrode is insulated from the emitter electrode,
the collector region is configured to be electrically connected to the collector electrode,
the trench gate electrode is bent when the semiconductor substrate is seen in a plan view,
an inner semiconductor region of the same conductivity type as the emitter region is formed at a position inside a bent portion of the trench gate electrode and exposed on the front surface of the semiconductor substrate, and
the inner semiconductor region is not configured to become electrically connected to the emitter electrode.

2. The IGBT according to claim 1, wherein the inner semiconductor region and the emitter region are made of the same composition.

3. The IGBT according to claim 1, further comprising an interlayer insulating film covering a surface of the inner semiconductor region and a surface of the trench gate electrode,
wherein the interlayer insulating film insulates the inner semiconductor region from the emitter electrode, and insulates the trench gate electrode from the emitter electrode.

4. The IGBT according to claim 1, wherein the trench gate electrode provides a pattern of connected T-shapes when the semiconductor substrate is seen in the plan view.

5. The IGBT according to claim 1, wherein the body contact region is separated from the inner semiconductor region by the body region when the semiconductor substrate is seen in the plan view.

6. The IGBT according to claim 1, wherein the body contact region is separated from the gate insulating film by the body region when the semiconductor substrate is seen in the plan view.

* * * * *